(12) United States Patent
Wang

(10) Patent No.: US 8,949,747 B1
(45) Date of Patent: Feb. 3, 2015

(54) DOUBLE PATTERNING COLORING WITH COLOR BALANCING

(71) Applicant: Cadence Design Systems, Inc., San Jose, CA (US)

(72) Inventor: Xiaojun Wang, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/725,878

(22) Filed: Dec. 21, 2012

(51) Int. Cl.
*G06F 17/50* (2006.01)

(52) U.S. Cl.
CPC ........ *G06F 17/5081* (2013.01); *G06F 17/5068* (2013.01)
USPC .......................................................... 716/54

(58) Field of Classification Search
USPC .......................................................... 716/54
See application file for complete search history.

(56) References Cited

U.S. PATENT DOCUMENTS

| | | | |
|---|---|---|---|
| 5,552,996 A | 9/1996 | Hoffman et al. | |
| 8,209,656 B1 | 6/2012 | Wang et al. | |
| 8,434,033 B2 | 4/2013 | Abou Ghaida et al. | |
| 8,434,043 B1 * | 4/2013 | Hsu et al. | 716/113 |
| 8,448,100 B1 | 5/2013 | Lin et al. | |
| 8,516,402 B1 * | 8/2013 | Wang | 716/52 |
| 8,627,245 B1 * | 1/2014 | Banerjee et al. | 716/55 |
| 8,647,893 B1 * | 2/2014 | Agarwal et al. | 438/16 |
| 2007/0031740 A1 | 2/2007 | Chen et al. | |
| 2010/0037200 A1 | 2/2010 | Ghan et al. | |
| 2011/0078638 A1 | 3/2011 | Kahng et al. | |
| 2011/0197168 A1 | 8/2011 | Chen et al. | |
| 2013/0007674 A1 | 1/2013 | Abou Ghaida et al. | |
| 2013/0024822 A1 | 1/2013 | Hsieh et al. | |
| 2013/0061185 A1 * | 3/2013 | Abou Ghaida et al. | 716/55 |
| 2013/0061186 A1 | 3/2013 | Hsu et al. | |
| 2013/0320555 A1 * | 12/2013 | Yu-Tseng et al. | 257/774 |

OTHER PUBLICATIONS

Portions of prosecution history of U.S. Appl. No. 12/251,455, May 18, 2012, Wang, Xiaojun, et al.

* cited by examiner

*Primary Examiner* — Suresh Memula

(74) *Attorney, Agent, or Firm* — Vista IP Law Group, LLP

(57) ABSTRACT

Some embodiments of the invention provide a method for balancing the assignment of shapes from a portion of an IC design layout to different masks. The method of some embodiments assigns the shapes to a plurality of masks in a manner that a variation between the numbers of shapes assigned to each mask is within a certain threshold. The method of some embodiments performs a separate analysis for shapes which are outside of a threshold distance from any other shapes.

23 Claims, 18 Drawing Sheets

DOUBLE PATTERNING COLORING WITH COLOR BALANCING

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 14 nm and below), the resolution of the photolithographic process makes it extremely difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

To enhance the feature density, the shapes on a single layer can be manufactured on two different photolithographic masks. This approach is often referred to as "Double Patterning Lithography (DPL)" technology. FIG. 2 illustrates an example of this approach. In FIG. 2, a design layout 205 specifies three features 210-230 that are pitch constrained and therefore cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

FIG. 3 illustrates sending five shapes 301-305 of a design layout 300 to two different masks. The shape pairs of the shapes 301 and 302; the shapes 302 and 303; the shapes 303 and 304; and the shapes 304 and 305 are all pitch constrained. Therefore, the two shapes of each pair must be sent to two different masks 310 and 315. Accordingly, the shapes 301 and 303 are sent to a first mask 310. That is, the shapes 301 and 303 are printed during a first exposure in order to produce contours 320. Similarly, the shapes 302, 304, and 305 are sent to a second mask 315. That is, the shapes 302, 304, and 305 are printed during a second exposure in order to produce contours 325. The resulting union of the contours 320 and 325 generates pattern 330 that is sufficient to approximately reproduce the original design layout 300.

To use DPL technology, the layout designers need to follow a set of design rules or constraints while designing the layout such that the shapes on a single design layer can be successfully fabricated using two different masks. However, even when the design rules are met, other issues may arise which affect the DPL process. The denser the layout of features on a screen is, even when it meets the necessary design rules, the higher the likelihood for potential problems with the printing process.

BRIEF SUMMARY

Some embodiments of the invention provide a method for assigning shapes from a layer of an IC design layout to different masks. In order to reduce the density of the masks, the method balances the distribution of features between the masks, reducing the overall density of the produced masks. The method of some embodiments assigns shapes to masks in a manner that results in an even distribution of shapes between the masks. In some embodiments, the method is performed by an EDA application.

In some embodiments, the method first classifies the received shapes into shape sets, where a shape set is a set of one or more shapes which contains all of the shapes that a shape is connected to. Two shapes are considered connected with a link when they are less than a threshold distance of each other. The threshold distance is the minimum same color spacing which is the minimum required distance between two shapes to be printed on a single mask. A shape set with more than one shape is a connected shape set and a shape set with only one shape with no connections is an isolated shape set.

The method then processes the connected shape sets, assigning the shapes to masks in order to satisfy the printing requirements, but also to balance the layouts of the two masks. In some embodiments, balancing the layouts includes dividing the shapes between the two masks so that each mask has a similar number of shapes. Alternatively or conjunctively, balancing the layout includes dividing the shapes between the two masks so that the areas covered by shapes on the masks are similar. In other embodiments, balancing the layouts may include alternative methods of balancing (e.g., based on feature types). The method then processes the isolated shape sets, offsetting the remaining imbalances as much as possible. In some embodiments, processing the isolated shape sets also takes into account the spread of the shapes within the masks. The method of some embodiments then displays the results of the mask assignment to the user, representing the different masks with different colors.

The preceding Summary is intended to serve as a brief introduction to some embodiments of the invention. It is not meant to be an introduction or overview of all of the inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

Figure 1:
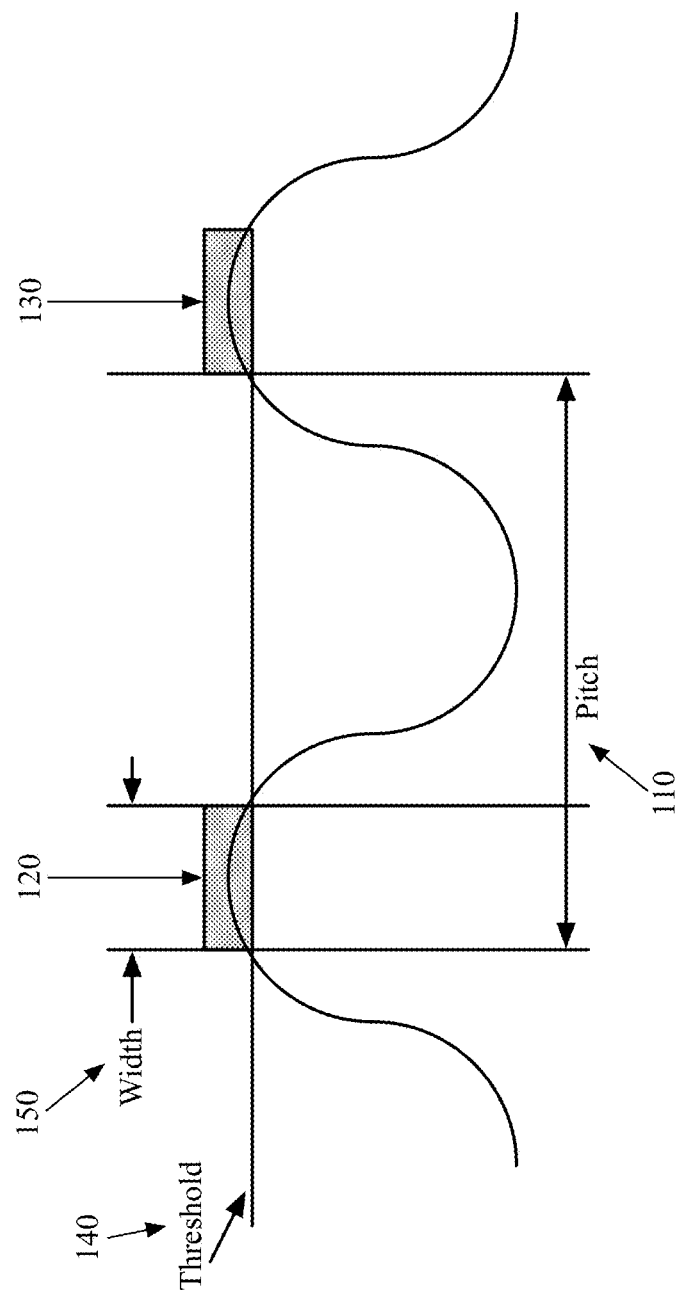
FIG. 1 illustrates a typical pitch constraint of a photolithographic process of some embodiments.
Figure 2:
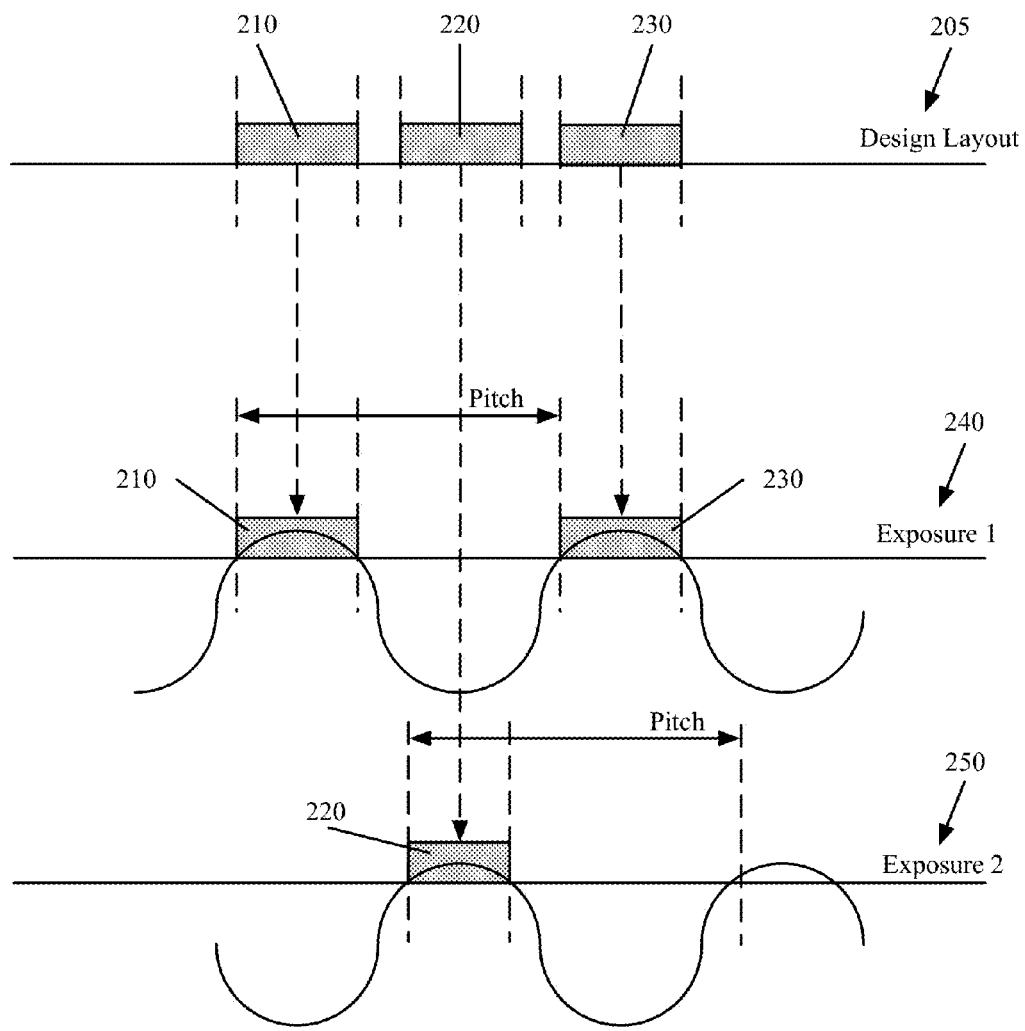
FIG. 2 illustrates an example of a multiple exposure photolithographic process of some embodiments.
Figure 3:
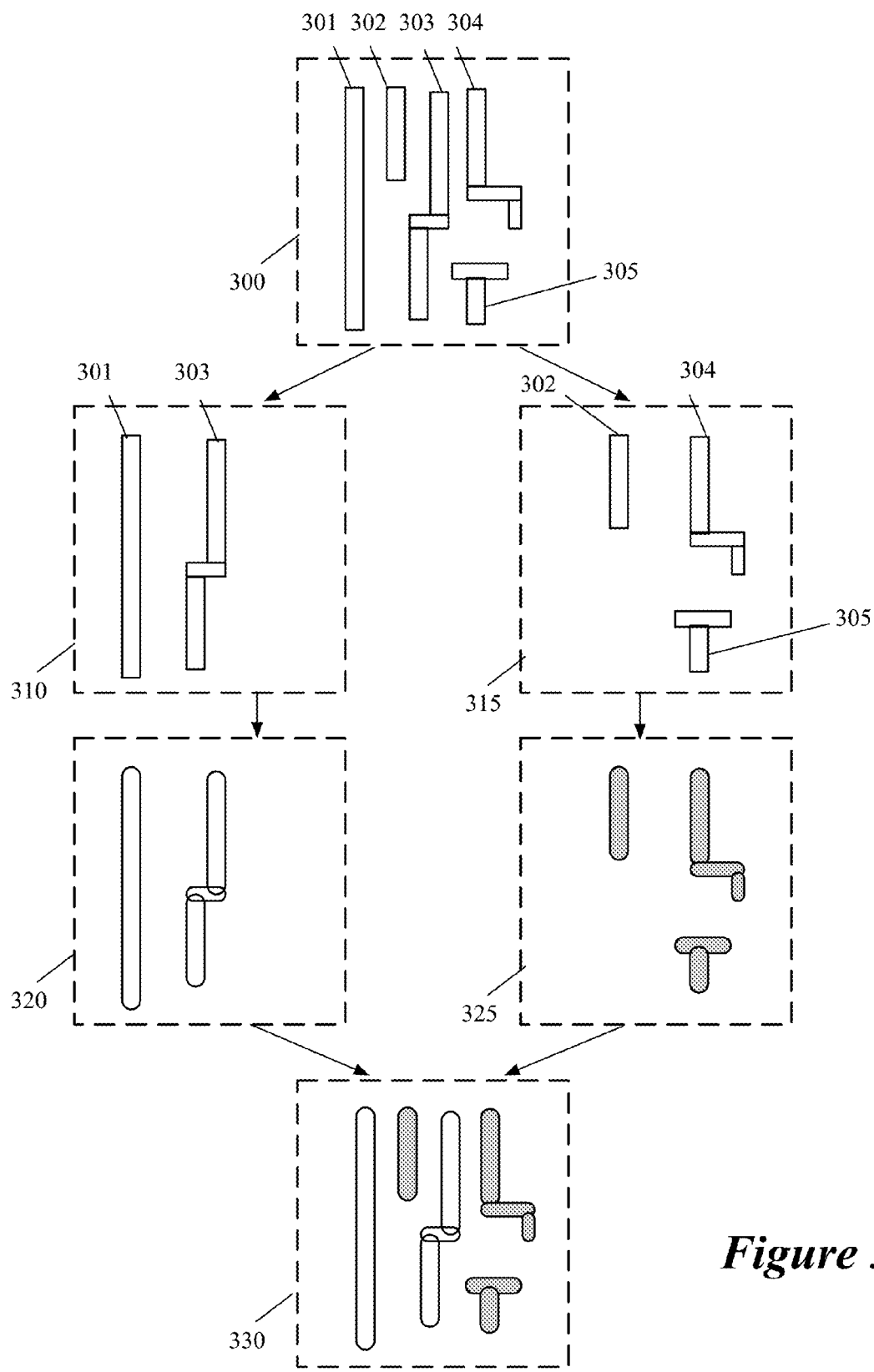
FIG. 3 illustrates two examples of Double Patterning Lithography technology.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. Mask Assignment

To use DPL technology, the layout designers need to follow a set of design rules or constraints while designing the layout such that the shapes on a single design layer can be successfully fabricated using two different masks. The EDA applications of some embodiments assign two colors (e.g., red and green) to the shapes to identify the two masks with which the shapes will be fabricated. Each shape on a design layer begins with its color unassigned. The EDA application of some embodiments assigns one of the two colors to each shape on the layer. Shapes that have been assigned to the same color must be spaced apart by at least a certain minimum distance specified by the design rules. Typically, the required minimum spacing between shapes assigned to the same color is greater than the required minimum spacing between two shapes with different colors because shapes with different colors are fabricated using different masks, bypassing the limitations of the single-exposure photolithographic process. In this application, the required minimum spacing between shapes assigned to the same color is referred to as a minimum same color spacing. The required minimum spacing between two shapes with different colors is referred to as a minimum spacing. Since a pitch specifies the sum of the width of a shape (i.e., feature) and the space on one side of the shape separating that feature from a neighboring shape, a minimum same color spacing is pitch minus the width of the shape in some embodiments. A specific color that is assigned to a particular shape is arbitrary. However, the assignment makes sure that the shapes adjacent to the particular shape that are spaced apart from the particular shape by less than the minimum same color spacing have different colors.

The EDA applications of some embodiments model each shape in a design layout as a node in a graph. Two nodes are connected when the corresponding shapes are apart from each other at a distance smaller than the minimum same color spacing. After this modeling process, the layout is represented as clusters of graphs in which nodes are connected. Each node in a graph is assigned a color in such a way to make sure that the neighboring nodes have different colors. This is because when the neighboring nodes (e.g., a connected pair of nodes) have the same color, the corresponding shapes would violate a design rule that requires two shapes with the same color are apart from each other at a distance greater than or equal to the minimum same color spacing.

Some embodiments of the invention provide a method for assigning shapes from an IC design layout to different masks. The method of some embodiments assigns shapes to masks in a manner that results in an even distribution of shapes between the masks, both in terms of area covered and density. The purpose for this mask assignment process is to generate masks which are balanced and on which the shapes are well-distributed. When masks are balanced and the shapes are well-distributed, it can reduce the occurrence of different problems during lithographic printing.

Figure 4:
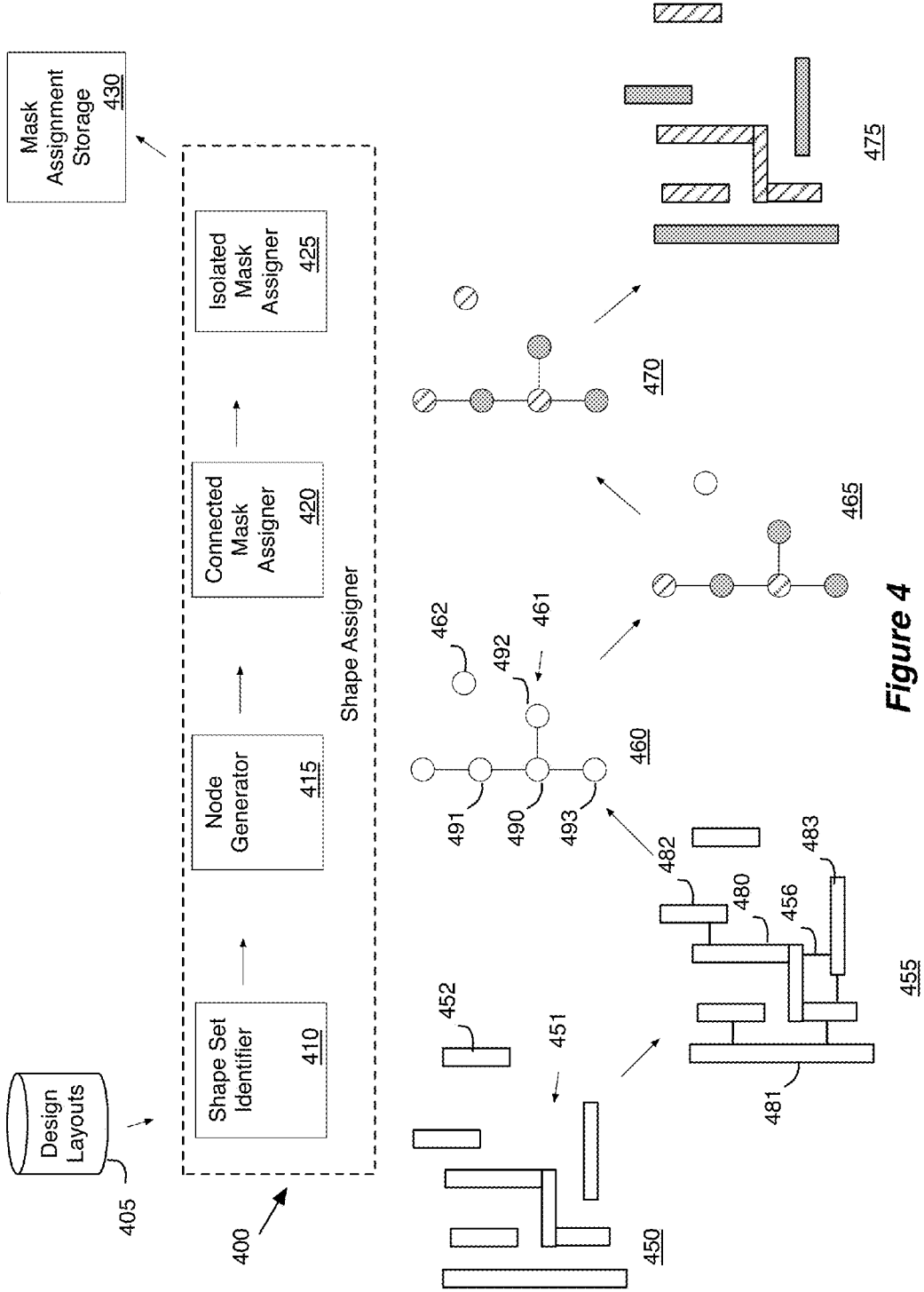
FIG. 4 conceptually illustrates a shape assigner for assigning shapes to masks.

FIG. 4 conceptually illustrates a shape assigner 400 for assigning shapes to masks in some embodiments of the invention. The shape assigner 400 receives the shapes from a layer of a design layout and assigns the shapes to two masks. In some embodiments, the shape assigner may work with only a portion of a layer of a design layout, in order to ensure balance for sections of a layer. For example, the balancing mask assignment may be performed separately on each quarter-section of a layer, providing for a better balance for the overall layer. In this application, references to a layer may also refer to subsections of a layer. FIG. 4 also illustrates a storage for design layouts 405 and a mask assignment storage 430 for storing the results of the mask assignment. FIG. 4 also illustrates the inputs and outputs of the shape assigner in six stages 450-475.

The design layouts 405 are generated by EDA applications, which circuit designers use to generate design layouts. As known in the art, design layout includes several design layers that represent an IC's multiple layers of wiring that interconnect the IC's electronic and circuit components. In some embodiments, the design layouts are in a database file format, e.g., GDS II stream format (GDSII).

The output in some embodiments displays the results to a user interface of an EDA application which allows the user to directly interact with the provided resolution hints. In other embodiments, the output may be a file format which stores the mask assignments for display at another location or for further processing in another application.

The shape assigner 400 assigns identifies the shapes of a design layout and assigns them to different masks for printing an IC design layout. In some embodiments, the shape assigner 400 is a stand-alone software application that is separate from an EDA application that generates and displays the design layouts. In other embodiments, the shape assigner 400 is part of the EDA application. As shown, the shape assigner 400 includes a storage for design layouts 405, a shape set identifier 410, a node generator 415, a connected mask assigner 420, an isolated mask assigner 425 and a mask assignment storage 430.

The shape assigner 400 receives a set of shapes from some storage of design layouts 405. The design layouts 405 may be from operating memory or from an external storage solution. In some embodiments, these shapes are the result of a user's interaction with a user interface for a circuit design program stored in an operating memory. In other embodiments, these shapes may be received from an external source (e.g., a network storage, an email attachment, etc.). These shapes represent various circuit design elements for a particular layer of a circuit design.

The shape set identifier 410 receives or retrieves the shapes of a layer of the design layout and identifies the connected and isolated shape sets in the design layout. The shape set identifier 410 evaluates the proximity of the different shapes to each other and creates a link (or connection) between two nodes (or shapes) when the distance between them is less than the minimum same-color-spacing of the design layout. A connection between two shapes indicates that the two shapes must be printed on separate masks. Two shapes are directly connected when a single connection exists between the two shapes and indirectly connected when an unbroken path of shapes and connections exists between the two shapes. A connected shape set refers to a set of shapes where every shape in the set is connected, either directly or indirectly to every other shape in the set. The shape set identifier 410 also identifies shapes which are not connected to any shapes. These shapes are identified as isolated shape sets.

In some embodiments, the node generator 415 then receives the shape sets of the layer of the design layout and generates a corresponding node set, where each node represents a shape and two nodes are linked when the corresponding shapes are connected. Each connected shape set results in a corresponding connected node set and each isolated shape set has a corresponding isolated node. The shapes and the nodes have a direct relationship, with each connected shape set corresponding to a connected node set and each isolated shape set corresponding to an isolated node. The use of node sets allows for simplified traversal of the nodes. In some embodiments, separate node sets are not generated and the mask assigner directly assigns the shapes to different masks. In other embodiments the shape set identifier 410 is not used at all and the node generator 415 identifies shapes and links, and generates a node set directly.

The connected mask assigner 420 then receives the generated node sets, identifies only the connected node sets and assigns the nodes of each connected node set to one of the masks. When masks are overlayed for printing, they present the composite image of the complete circuit design. The connected mask assigner 420 assigns the nodes to each mask such that every node which is connected to another node is assigned to a different mask than the node(s) to which it is connected. In addition, the connected mask assigner 420 balances the distribution of the nodes between the masks. In some embodiments, balancing the layouts divides the shapes between the two masks so that each mask has a similar number of shapes. In other embodiments, the balancing the layout divides the shapes between the two masks so that the areas covered by shapes on the masks are similar. This assignment is described in further detail with reference to FIG. 7 below.

The isolated mask assigner 425 performs a similar function to the connected mask assigner 420, but identifies only the isolated nodes and assigns the isolated nodes to the masks. Like the connected mask assigner 420, the isolated mask assigner 425 performs the assignments in a manner to balance the distribution of the nodes between the masks and to maximize the average distance between the elements within each mask.

The mask assignment storage 430 stores the results of the generated mask assignments. The mask assignment storage 430 may store the results in an operating memory of an EDA application, displaying the results for a user. In such a display, each mask may be displayed separately or as different colors in some embodiments. In some embodiments, the mask assignment storage 430 stores the results in a text or binary format for future display or use.

Figure 5:
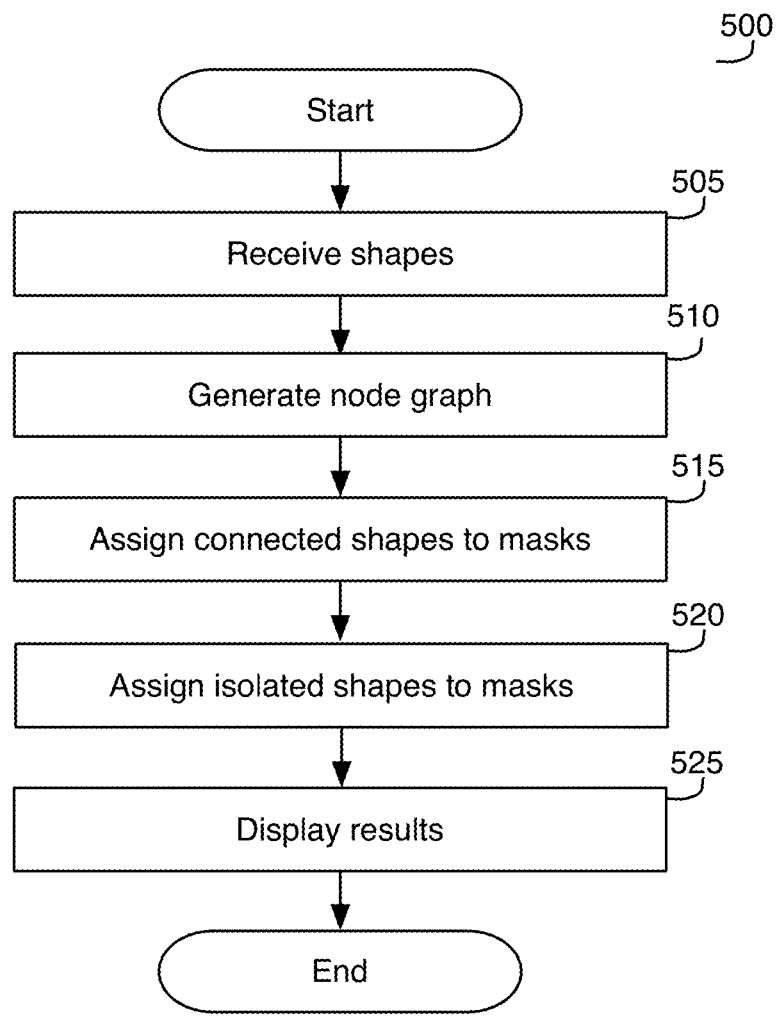
FIG. 5 illustrates a process for the shape assigner referenced in FIG. 4.

An example operation of the shape assigner 400 will now be described by reference to FIGS. 4 and 5. FIG. 5 illustrates a process 500 for the shape assigner 400 referenced in FIG. 4. In some embodiments, the process 500 is performed by an EDA application. The process 500 receives (at 505) the shapes that make up a circuit design. These shapes may be received from an EDA application or from some other input or storage device, such as the storage for the design layouts 405. These shapes may represent vertical interconnect access (via) connections or other logic circuits. The process 500 receives the shapes represented in the stage 450 and identifies the shape sets as illustrated in the second stage 455. In this example, 452 is an isolated node while the remaining five shapes 451 form a connected shape set because the shapes are connected to each other. These connections are represented by a line, such as line 456. Each shape in the connected shape set has at least one line to another shape.

The process 500 then generates (at 510) a node graph based on the received shape sets, assigning each shape to a node and creating links between nodes whose shapes are connected. The isolated shape set 452 is represented with an isolated node 462 and the connected shape set 451, along with the corresponding connections are represented by the connected node set 461. The shape 480 is represented with node 490. The shape 480 has connections to three other shapes 481-483. Likewise, the node 490 has links to nodes 491-493. Node generation will be discussed below in further detail with reference to FIG. 6. In some embodiments, the links are identified before the node generation, while in other embodiments, the identification of the links is part of the node generation.

The process 500 then assigns (at 515) the nodes of the connected node sets to the masks. The process 500 identifies all of the connected node sets and processes them individually. The fourth stage 465 shows that each node of the connected node set 461 has been assigned to a mask. The two masks are illustrated by a grey color and a striped pattern in this figure. These nodes are assigned in a manner such that no two nodes which are directly connected are assigned to the same mask, but also such that the masks are balanced. This process will be discussed further below with reference to FIGS. 7-9.

The process 500 assigns (at 520) the nodes of the isolated nodes to the masks. Unlike the connected node sets, there are no restraints on the placement of the isolated nodes because isolated nodes are more than the minimum same color distance from any other node. The isolated mask assigner uses the isolated node sets to significantly reduce any remaining imbalances between the masks. The fifth stage 470 illustrates a simple example where the remaining isolated node 462 has been assigned to the striped mask, balancing the nodes with three nodes to each mask.

The process 500 then outputs (at 525) the results of the mask assignment to a mask assignment storage 430. In some embodiments, the results are displayed in a display area of an EDA application for circuit layout design. However, in other embodiments, the results may be stored, sent to another module for further processing, or sent to a printer. The sixth stage 470 shows the displayed results of some embodiments, where the colors of the nodes are assigned to the corresponding shapes and presented for viewing by the user of the application.

A. Generating a Node Set

Figure 6:
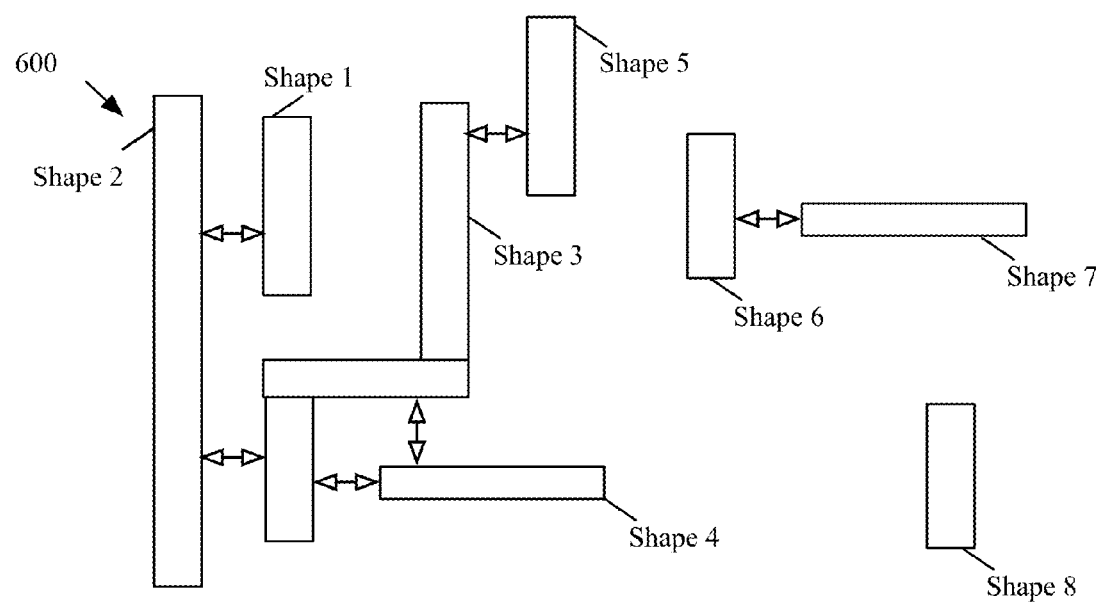
FIG. 6 illustrates an example of this node generation.
Figure 6:
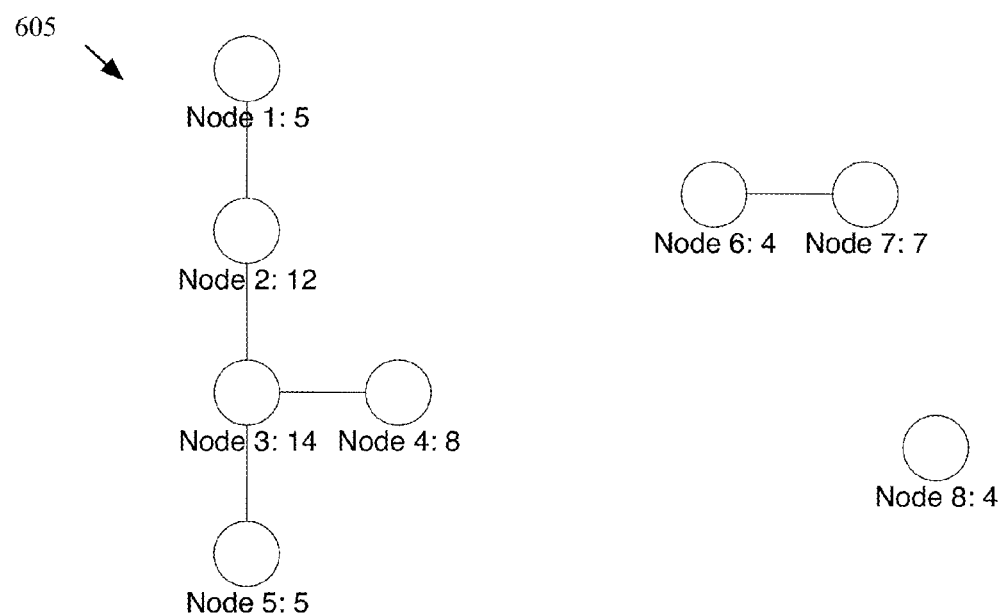

FIG. 6 illustrates an example of the node generation process of some embodiments. The top half of the illustration 600, illustrates the shapes 1-8 received from a design layouts storage while the bottom half 605 illustrates the generated nodes 1-8 corresponding to the shapes 1-8 respectively. Connections between two shapes are illustrated by the double-headed arrows and are illustrated by links between the corresponding nodes. These connections and links represent that the corresponding shapes are within a threshold distance (e.g., minimum same color spacing) from each other. Shapes within the threshold distance cannot be printed on the same mask.

Shape 3 has connections with shapes 2, 4, and 5. Node 3 has links with nodes 2, 4, and 5. Shape 2 also has a connection to shape 1 and node 2 has a corresponding link to node 1. Shapes 1 and 3 are not connected because the distances between them are greater than the threshold distance. Shapes 1-5 make up a single connected shape set because each shape is either directly or indirectly connected to the other shapes. Nodes 1-5 make up a connected node set. Shapes 6 and 7 also form a connected shape set and nodes 6 and 7 form a connected node set because they are connected to each other. Shape 8 and node 8 are an isolated shape set and an isolated node because they have no connections to any other shape or node.

In some embodiments, the nodes are weighted according to the area of the individual shapes. Shapes which cover a large area may be weighted more heavily than smaller shapes which cover less area. Weighting the nodes accounts for the increased effect of larger shapes on the density of each mask. The node sets 605 show nodes 1-8 which have been weighted according to the area of the corresponding shape. Node 1 has a weight of 5, whereas node 2 has a weight of 12, illustrating that shape 2 covers a much larger area than shape 1.

B. Assigning Connected Graphs

Figure 7:
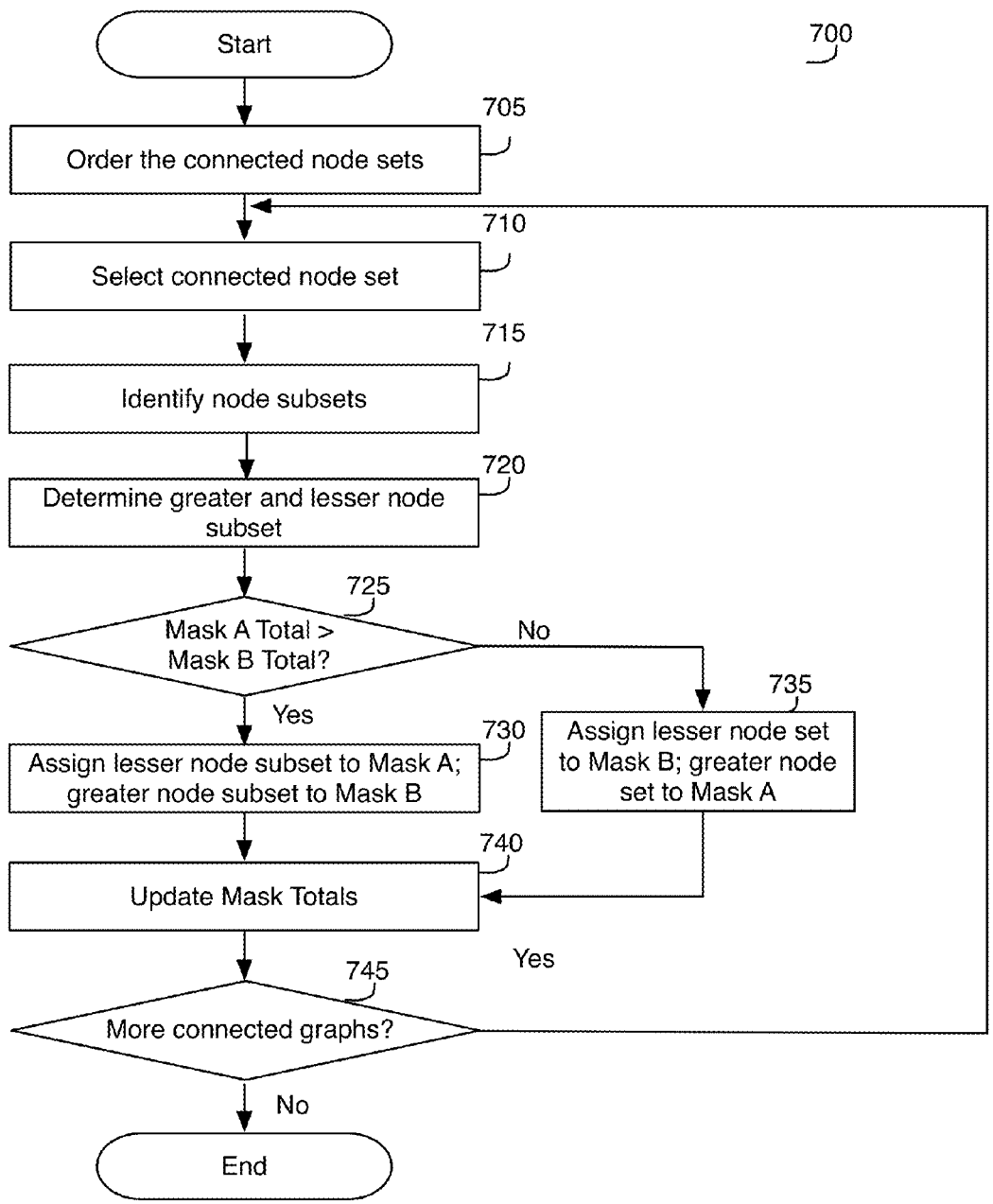
FIG. 7 conceptually illustrates a process 700 for assigning the nodes of the connected node sets of some embodiments.

The node generation performed by the connected mask assigner 420 will now be described with reference to FIGS. 7 and 8. FIG. 7 conceptually illustrates a process 700 performed by the connected mask assigner 420 to assign the nodes of the connected node sets in some embodiments. The process 700 starts when receiving node sets of a layer of a circuit design.

The process 700 begins by ordering (at 705) the connected node sets of the layer of the circuit design. In some embodiments, the order is determined based on the coordinates of the root node of each connected node set. The root node is defined as the left-bottom-most node of each node set in some embodiments. In other embodiments, the order may be determined based on the weighting of the nodes of the connected node set. After the node sets are ordered, the process 700 selects (at 710) the first connected node set in the ordered list.

At 715, the process 700 divides the node set into two node subsets, one for each mask, where all of the nodes in each subset are to be assigned to a single mask. FIG. 8 illustrates in five different stages 805-825, an example of the indexing process used by a module of the mask assigner to divide the nodes into node subsets while ensuring that connected nodes are assigned to different masks. Each stage shows a connected node set 800 which includes a root node 850.

The first stage 805 illustrates the node set before the indexing begins. This node set is an example of one of the node sets output by the node set generation stage above. The second stage 810 shows the module selecting and indexing the root node 850. In some embodiments, the root node is defined as the bottom-left-most node of the group. The root node may be defined differently in other embodiments. In some embodiments, the geometric location of the root node is used when ordering the connected node sets as in operation 705 of the process 700. The module designates the root node 850 as part of a first subset, as indicated by the number 1.

The third stage 815 illustrates the module traversing the node set in a breadth first manner, assigning all of the root node's 850 child nodes (i.e., nodes 855 and 860) to a second subset, indicated by the number 2. The fourth stage works similarly, illustrating the module assigning the grandchildren (i.e., nodes 865-875) of the root node 850 to the first subset. This continues until all the nodes are assigned to one of the subsets, as shown in the last stage 825. In this way, each node will be assigned to a different subset than the nodes it is connected to.

Figure 9:
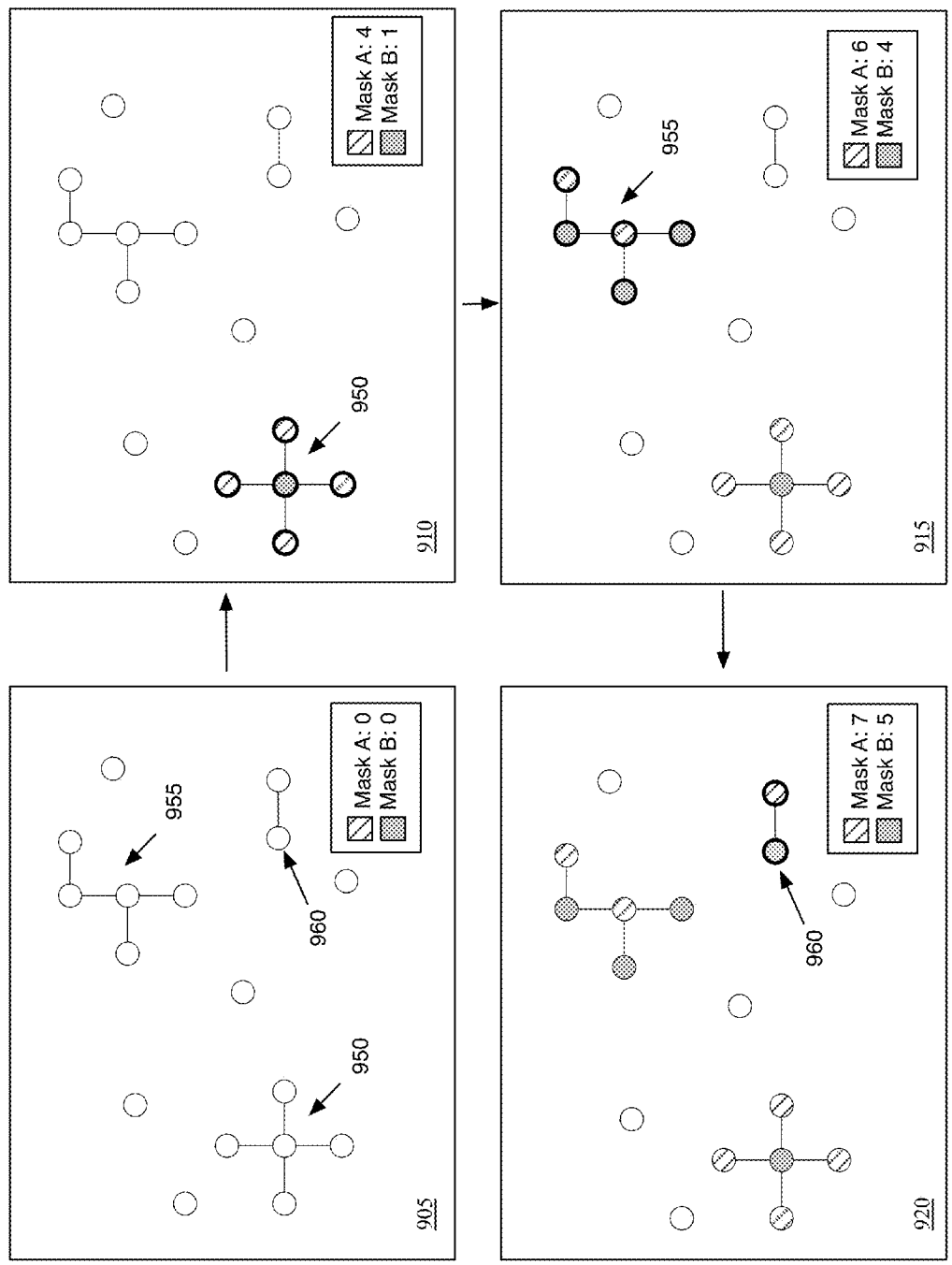
FIG. 9 illustrates an example of the mask assignment process for a set of connected node sets.

In some embodiments, the node subsets for each connected node set may be evaluated prior to ordering the connected sets in the operation 705 of FIG. 9. In some of these embodiments, rather than a geometric location or weighting of a node set, the ordering of the connected node sets may be based on the disparity or difference between the aggregate values of the subsets. For example, it may be beneficial to assign a node set with subset values of 14 and 1 with a disparity of 13 before a node set with subset values of 30 and 32 with a disparity of 2, even though the second node set may be much larger than the first. Node sets where the aggregate value of one subset is much greater than the aggregate value of the other subset may be assigned first to ensure that the largest disparities are handled first.

Once the nodes are separated into separate node subsets, the process 700 identifies (at 720) the greater and lesser node subsets by determining which node subset is larger, the larger node subset being the greater node subset and the smaller group being the lesser node subset.

The larger node subset may be determined by a simple count of the number of nodes in each node subset. In other embodiments, the larger subset may be determined by the sum of the weighted values of the member nodes in each node subset.

At 725, the process 700 determines whether the value of the nodes already assigned to a first mask (Mask_A_Total) is greater than the value of the nodes assigned to a second mask (Mask_B_Total). When Mask_A_Total is greater than Mask_B_Total, then the process 700 assigns (at 730) the lesser node subset to mask A and the greater node subset is assigned to mask B. When Mask_A_Total is less than Mask_B_Total, then process 700 assigns (at 735) the lesser node set to mask B and the greater node set to is assigned to mask A. In either case, the process 700 then updates (at 740) the mask totals (A and B) to reflect the addition of the new nodes, and determines (at 745) whether there are any more connected node sets in the layer of the circuit design. When more connected node sets exist, the process loops back to 710. Otherwise, the process 700 ends.

FIG. 9 illustrates an example of the mask assignment for a set of connected node sets in four stages 905-920. The first stage 905 illustrates a series of node sets generated from shapes received from a layer of a design layout. In this example, there are three connected node sets, 950-960 and five isolated nodes. In the connected mask assignment, only the connected node sets are processed.

Figure 8:
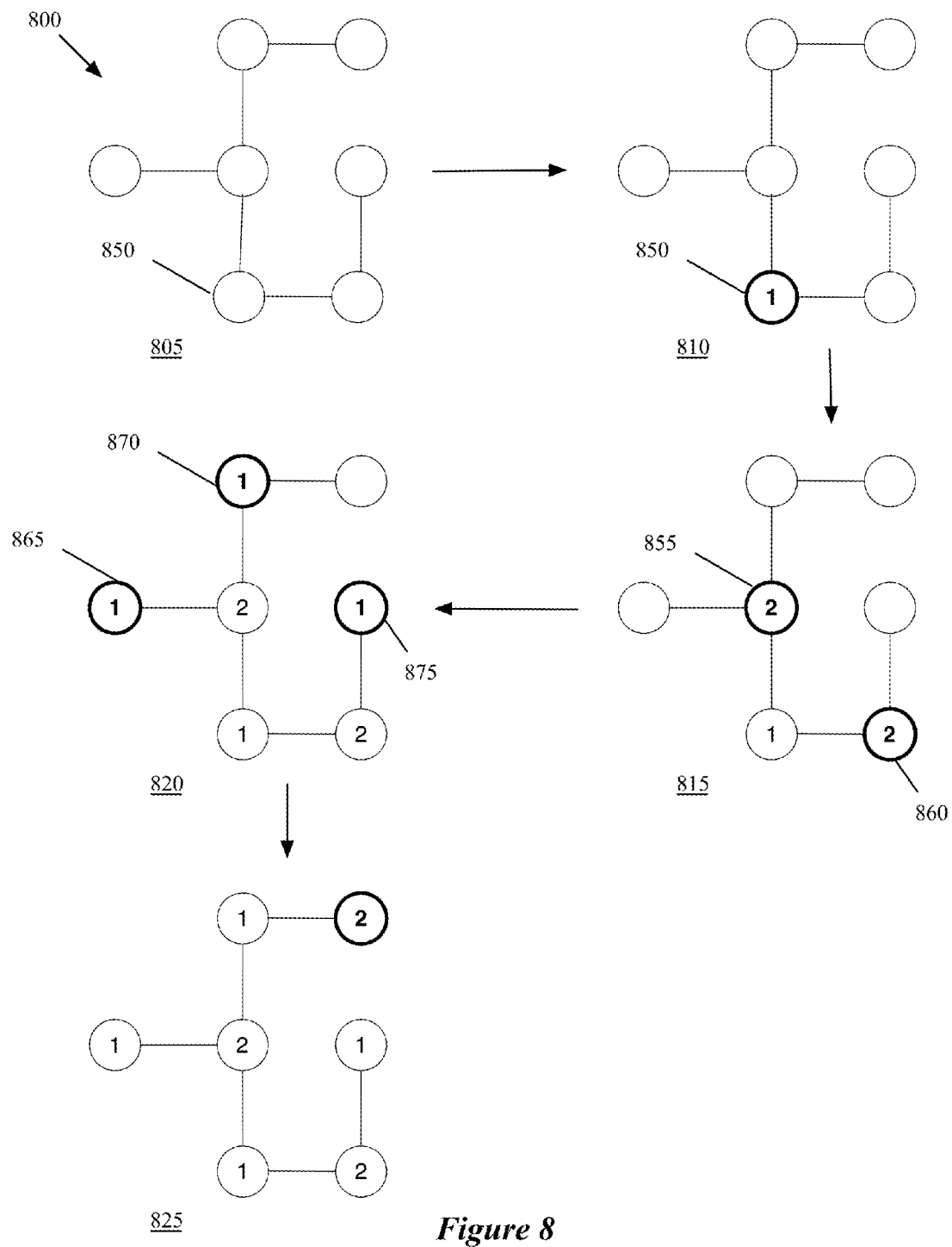
FIG. 8 illustrates in five different stages, an example of the indexing process used to divide the nodes into node subsets while ensuring that connected nodes are assigned to different masks.

The second stage 910 shows the result of the node assignment described in FIG. 8 on connected node set 950, with a subset of four nodes and a subset of one node that must be assigned to separate masks. However, since none of the nodes have been assigned yet, the nodes can be assigned to either mask. In the second stage, the connected mask assigner 420 assigns the subset with four nodes to mask A and the subset with a single node to mask B.

The third stage 915 shows the set of connected node sets after assigning the nodes of the second connected node set 955. The second connected node set 955 has one subset of three nodes and another subset of two nodes that must be assigned to different masks. This time, since the two masks have an unequal distribution of shapes, the greater node group (i.e., the group with three nodes) will be assigned to the mask with fewer shapes (i.e., mask B). This results in mask A now having six nodes and mask B having four. As noted above, in some embodiments, each node could be weighted and the value of a subset would be the sum of the weighted values of the nodes of each subset.

The last stage 920 proceeds similarly, showing the set of connected node sets after assigning the nodes of the third connected node set 960. Because the connected node has an equal amount of nodes that must be assigned to separate masks, the connected mask assigner 420 can assign either subset to masks A and B. The end result is that mask A has seven nodes and mask B has five.

C. Assigning Isolated Graphs

Figure 10:
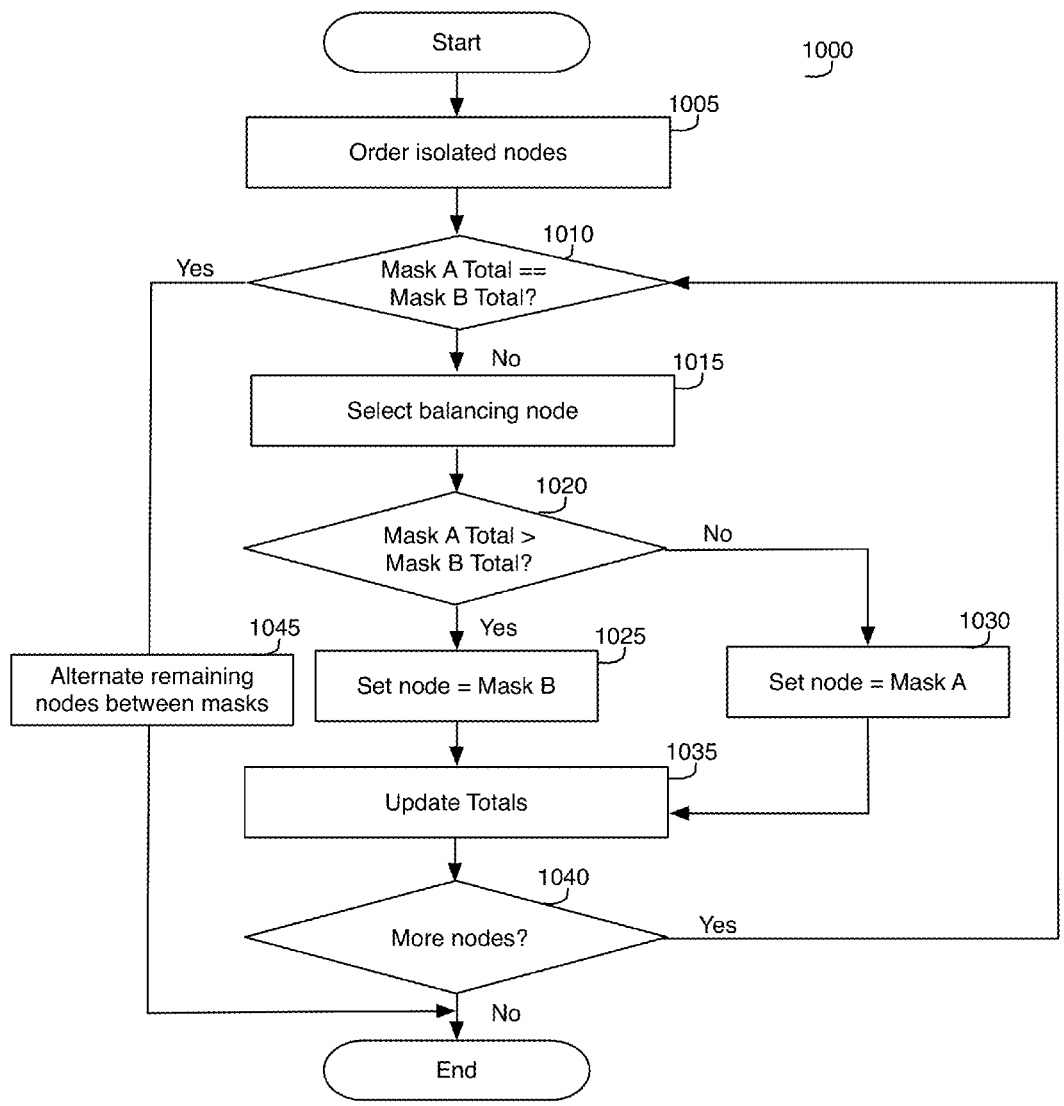
FIG. 10 illustrates a process for processing the isolated nodes of some embodiments.

Once all of the connected node sets have been assigned to masks, FIG. 10 conceptually illustrates a process 1000 used by the isolated mask assigner 425 for processing the isolated nodes of some embodiments. The process 1000 starts when receiving node sets of a layer of a circuit design.

The process 1000 begins by ordering (at 1005) the isolated nodes similar to the operation 705 of ordering the connected node sets in FIG. 7. The order may be determined in different ways. In this example, the process 700 uses the geometric locations of the node sets. Other factors such as the weight of the nodes may also be used to determine the ordering of the nodes. The process 1000 then compares (at 1010) the mask A and mask B Totals after all of the connected node sets have been processed. In the case where the nodes are unweighted and the masks are already balanced, then the process 1000 assigns (at 1045) the isolated nodes to both of the masks in an alternating fashion. However, when the nodes are weighted, the process 1000 may continue to selectively assign nodes to different masks even after the masks are balanced because each node may be weighted differently.

When the masks need to be further balanced, the process 1000 selects (at 1015) a balancing node. A balancing node, in some embodiments, is a node which helps to balance the two masks. The selection of the balancing node may be different in different embodiments. In some embodiments, such as when the nodes are weighted and ordered from largest to smallest, the balancing node may simply be the next node remaining in the ordering of the nodes. However, in other embodiments, when nodes are not weighted or when a series of nodes are weighted equally, the balancing node may be the node which is the furthest from the previously assigned nodes. For example, where the nodes have been ordered from 1 to n based on their geometric location across the layer, where n is the number of isolated nodes in the layer, the first balancing node may be the node at index 1. The second balancing node would be the node furthest from 1 at the other end of the layer, which would be the node at index n. After that, the node furthest from both and n would be the node at n/2. The indices of the balancing nodes, in some embodiments may be 1, n, n/2, n/4, n3/4, etc. In other embodiments, other methods of selecting a balancing node may be used.

After the balancing node has been selected, the process 1000 determines (at 1020) whether Mask_A_Total is greater than the Mask_B_Total. When mask A has more nodes or has a weighted value greater than mask B, then the process 1000 assigns (at 1025) the balancing node to mask A. Otherwise, then the process 1000 assigns (at 1030) the balancing node to mask B. The process 1000 then updates (at 1035) mask totals (A and B) to reflect the assignment of the balancing node. The process 1000 then determines (at 1035) whether there are any more isolated node sets in the layer. When more isolated node sets remain, the process 1000 then loops back 1005. Otherwise, the process 1000 ends.

Figure 11:
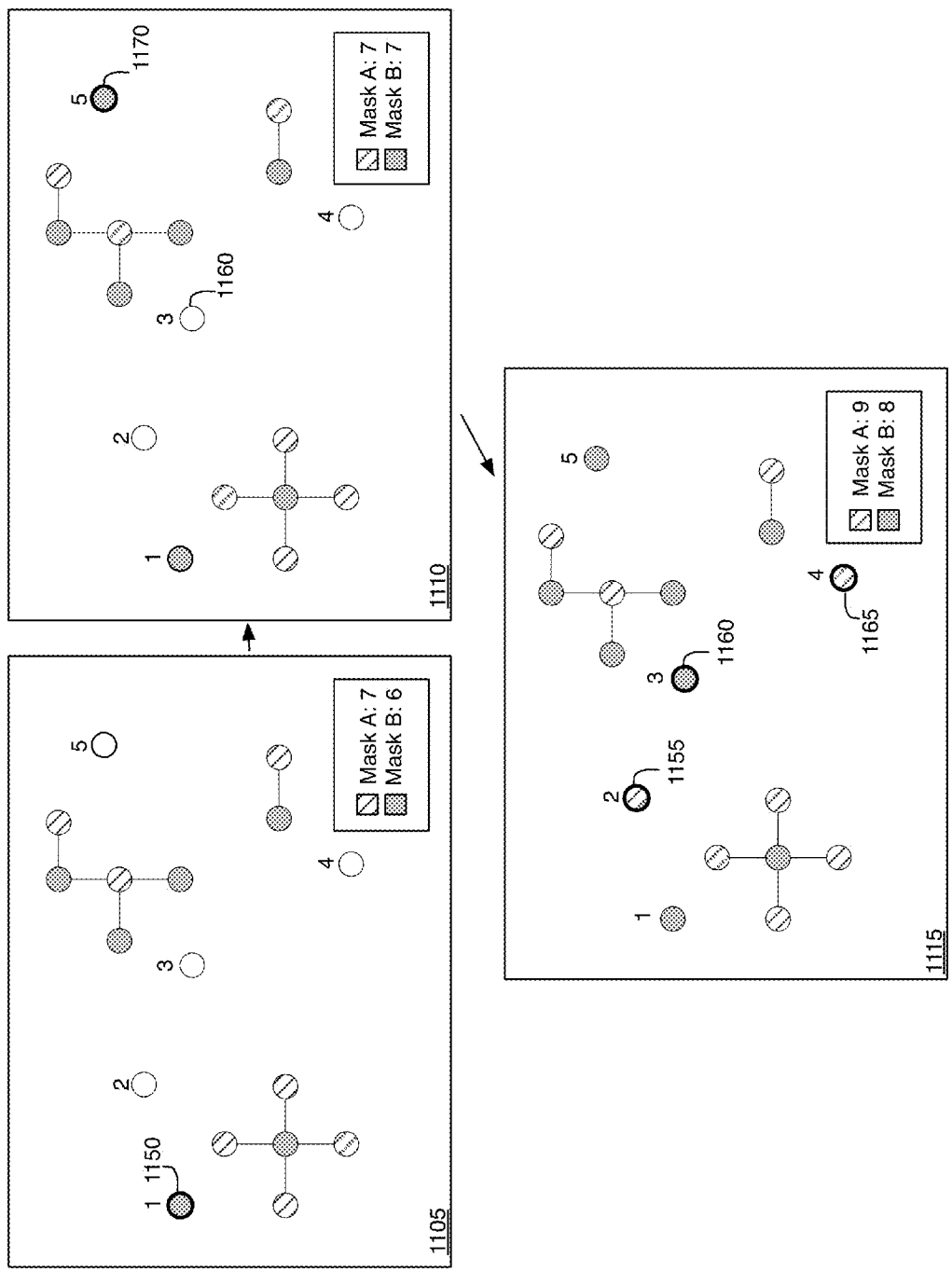
FIG. 11 continues the example of FIG. 9 with the mask assignment process for isolated nodes.

FIG. 11 continues the example of FIG. 9 with the mask assignment for isolated nodes for unweighted nodes. FIG. 11 shows in three stages 1105-1115, the mask assignment of isolated nodes 1150-1170. The isolated mask assigner 425 orders and indexes the isolated nodes (indicated with the numbers 1-5 above the nodes) based on their distance from the origin at the bottom-left corner of the layer in some embodiments. Once they have been ordered and indexed, the first stage 1105 shows the selection of the node at index 1 1150, has been selected and assigned to mask B because mask B has fewer nodes than mask A.

The second stage 1110 shows that the second balancing node is the node at the index 5 1170 because it is the furthest from the nodes already assigned (i.e. node 1150). If any more balancing nodes were required, the isolated mask assigner 425 would have selected node 1160 would have been selected because it is the furthest from the nodes already assigned (node 1 and node 5).

In some embodiments, the node is not selected based on the nodes already assigned, but based on the distance from the lower-left corner of the layer. Since the mask totals (A and B) have been balanced, the remaining nodes are distributed as evenly as possible between the masks. The results are shown in the last stage 1115.

Figure 12:
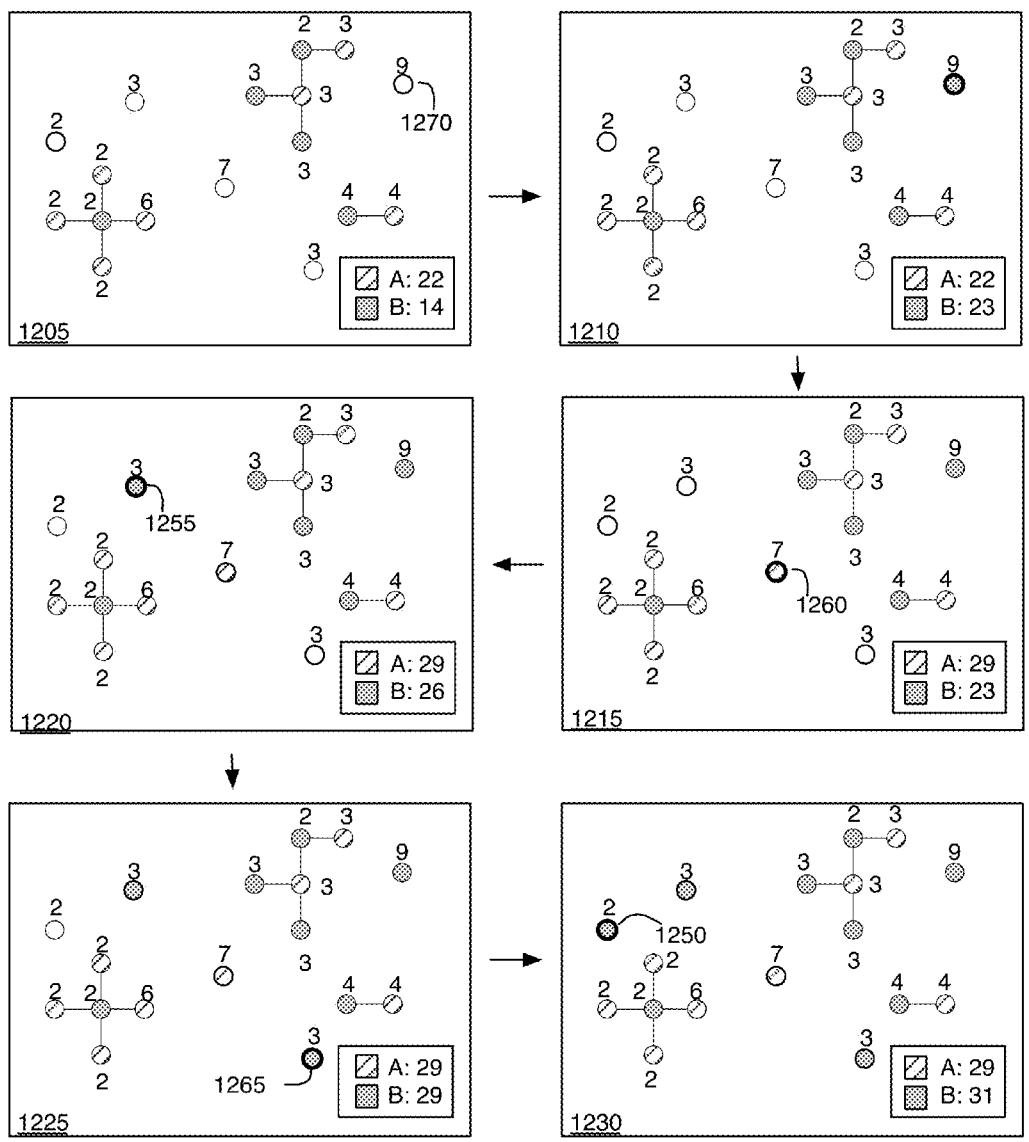
FIG. 12 illustrates another example of the mask assignment process for isolated nodes.

FIG. 12 illustrates another example of the mask assignment for isolated nodes in six stages 1205-1230, but with weighted nodes. In this example, the nodes 1250-1270 are weighted and the numbers above the nodes indicate their weighted value. In some embodiments, the isolated mask assigner 425 orders the isolated nodes in descending order based on their weighted values (1270, 1260, 1255, 1265, 1250). These nodes are weighted 9, 7, 3, 3, and 2 in this example.

The first stage 1205 shows the connected mask assigner 420 has already assigned the nodes of the connected node sets, assigning a total value of 22 to mask A, while assigning only a total value of 14 to Mask B. Weighted nodes are more likely to have larger disparities between the masks. The isolated mask assigner 425 selects node 1270, with a weighted value of 9 to be processed. The second stage 1210 shows the isolated mask assigner 425 assigning node 1270 has to mask B, increasing the total value of Mask B to 23.

The third stage 1215 shows that the isolated mask assigner 425 assigns the next largest node 1260 to Mask A, increasing the total value of Mask A to 29. The isolated mask assigner 425 continues to assign nodes to masks in stage 1220 until the masks are balanced in the fifth stage 1225. However, in the case of weighted nodes, the isolated mask assigner 425 continues to check whether masks are balanced because each node may have a different value. For example, if there were 2 additional nodes with a weighted value of 1, rather than being assigned alternatingly to both masks, they would both be assigned to mask A.

Figure 13:
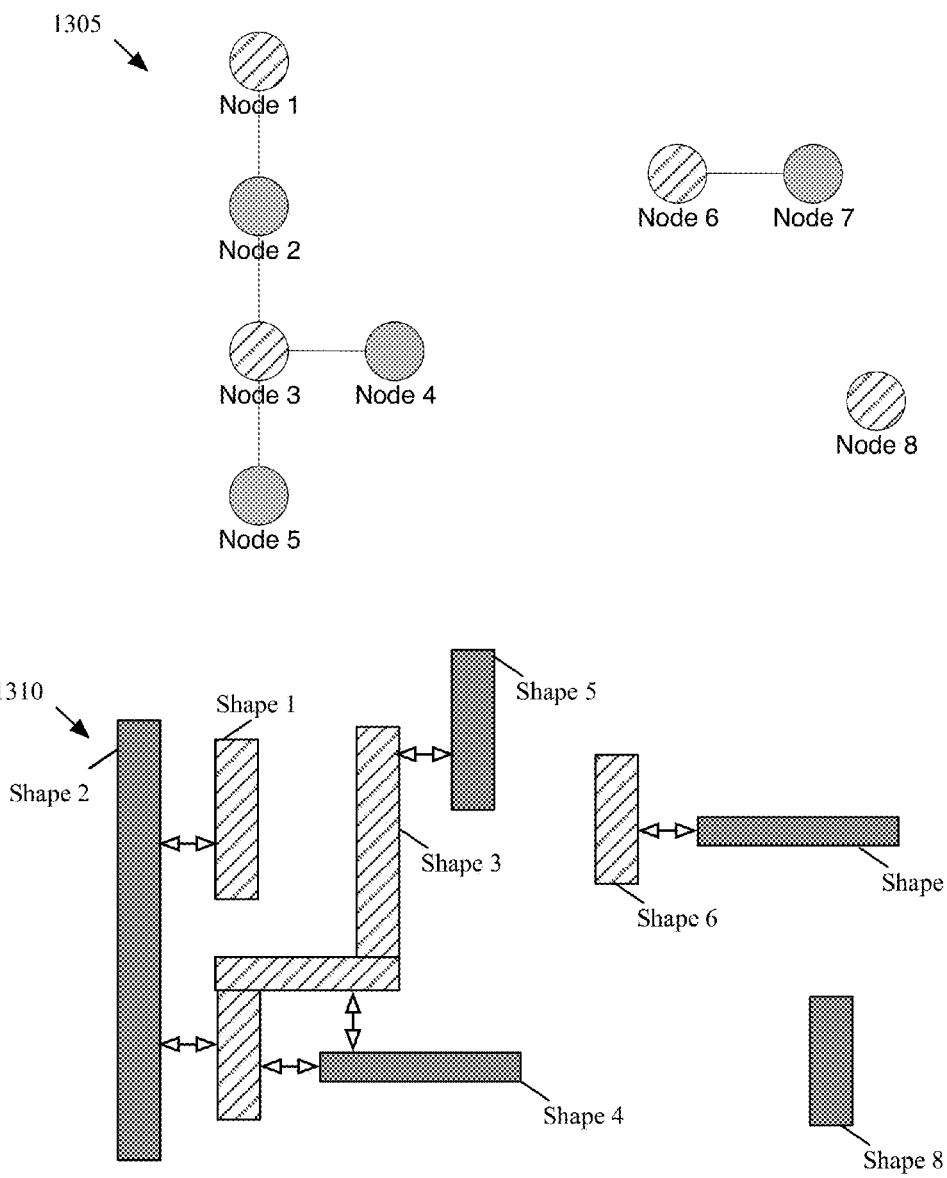
FIG. 13 illustrates an example of the results of the process on the node sets and the design layout from FIG. 6 that may be displayed as a result of the mask assignment.

FIG. 13 illustrates an example of the results of mask assignment on node sets and shapes of a layer of a design layout. The node set layout 1305 and shape set layout 1310 show the node set layout 605 and shape set layout 605 described in FIG. 6 after they have been processed by the mask assigner described above. Each shape in the shape sets 1310 is assigned to a different mask than the mask of any shape connected to it. In addition, a similar number of shapes is assigned to each mask as four shapes are assigned to each mask in this example. In other embodiments, the weighted value of each mask would be balanced.

Figure 14:
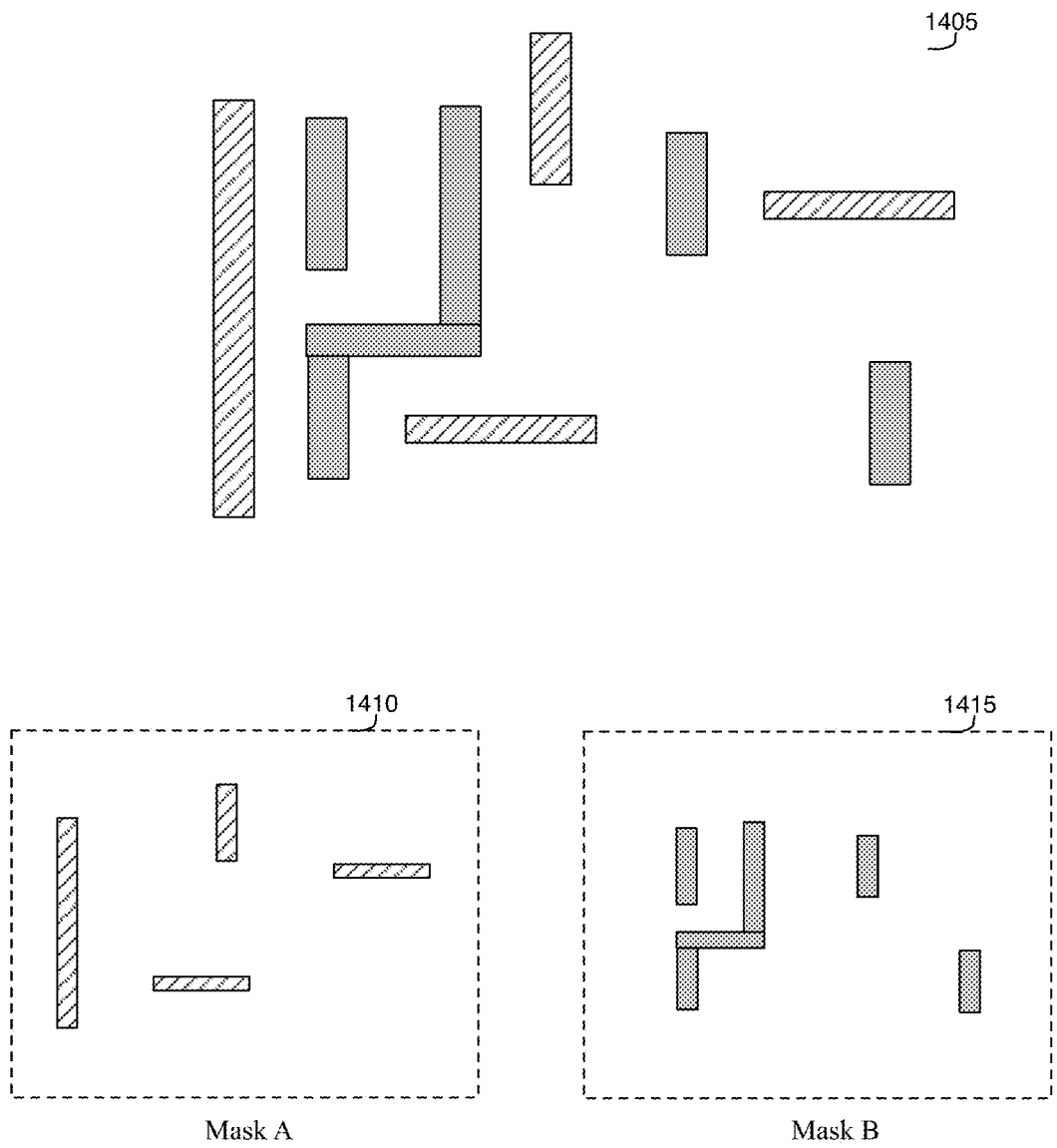
FIG. 14 illustrates the benefit of the balanced mask assignment.

FIG. 14 illustrates the benefit of the balanced mask assignment. The balanced mask assignment provides a balanced distribution of the circuit shapes to improve printing results. The shape layout 1405 illustrates the shapes of the layer after the shapes have been assigned to different masks. The masks 1410 and 1415 illustrate the distribution of the shapes to the masks, with the shapes on each mask conforming to the manufacturer constraints for each mask.

D. Pre-Seeded Graphs

In some cases, nodes may be pre-seeded or pre-assigned to a particular mask. This may be done to ensure that certain design features are printed together. When the received circuit design has shapes which are pre-assigned to a particular mask, the mask assignment will require slight adjustments.

Figure 15:
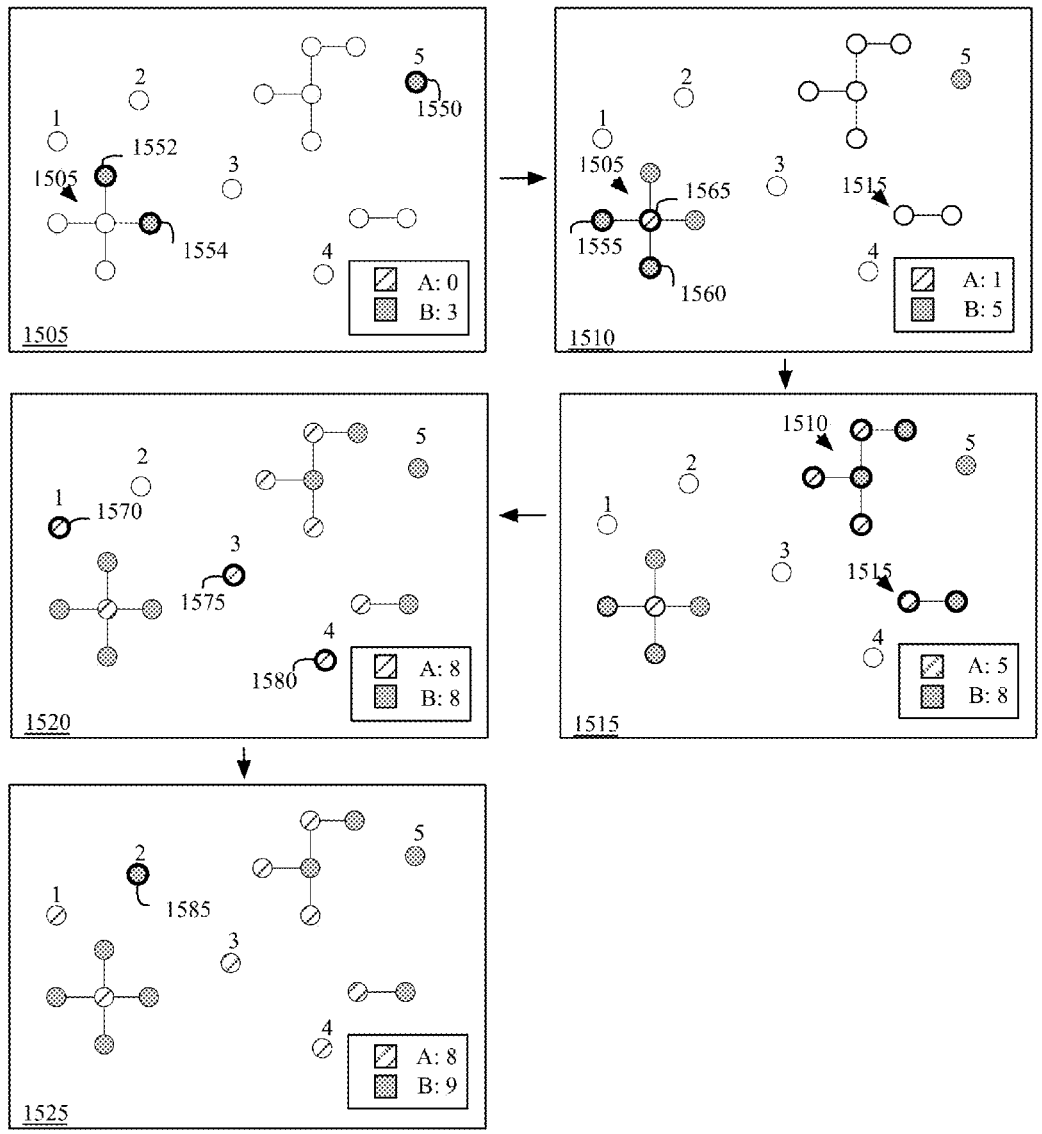
FIG. 15 illustrates the process for mask assignment when some of the nodes have been pre-assigned to a mask.

FIG. 15 illustrates, in four stages, a mask assignment when some of the nodes of the layout have been pre-assigned. The primary difference from the mask assignment described in FIG. 5 is that, before the connected mask assigner 420 processes the connected node sets the connected mask assigner 420 first processes the pre-seeded isolated nodes and the connected node sets with at least one pre-seeded node. In some embodiments, this functionality is performed by a separate pre-seed assigner module. The pre-seed assigner assigns any unseeded nodes in the connected node sets, totals the node counts and removes the nodes and node sets from future processing. When nodes are pre-seeded, the mask assignments are already determined for each node in the node set, so there is no balancing step.

The first stage 1505 shows the node layout from FIG. 9, but in this example, three of the nodes have been pre-seeded. Isolated node set 1550 and two of the nodes 1552 and 1554 of connected node set 1505 have been pre-seeded to mask B. The mask total for mask B has been updated with the count for the three pre-seeded nodes. Alternatively or conjunctively, the total for mask B may be updated with the sum of the weighted values of the pre-seeded nodes. Before processing either the connected node sets or the isolated nodes, the pre-seed assigner processes all of the node sets and isolated nodes which are pre-seeded. The indexing and mask assignments have already been determined by the user, so there is no balancing step.

In the second stage 1510, for each connected node set with at least one pre-seeded node, rather than selecting a root node, the pre-seed assigner selects a pre-seeded node 1552 of the connected node set. The pre-seed assigner assigns the remaining nodes of the connected node set 1505 to the required masks and updates the mask totals (A and B). In this example, the pre-seed assigner assigns node 1565 to mask A and nodes 1555 and 1560 to mask B. The values for the updated nodes 1555-1565 are updated in the mask totals, updating mask A to 1 and mask B to 5. Once the pre-seed assignment completes, the mask assignment continues with the updated mask totals and processes the remaining node sets and isolated nodes as before.

In the third stage 1515, the remaining connected sets 1510 and 1515 are assigned to masks using the balancing mask assignment described above in FIG. 7 to reduce the disparity in the total values of masks A and B. In the fourth stage, the isolated node sets are used to balance the remaining mask disparities by assigning three nodes 1570-1580 to mask A. In the last stage 1525, the remaining node 1585 is then assigned to one of the masks to complete the mask assignment.

II. User Interface

Figure 16:
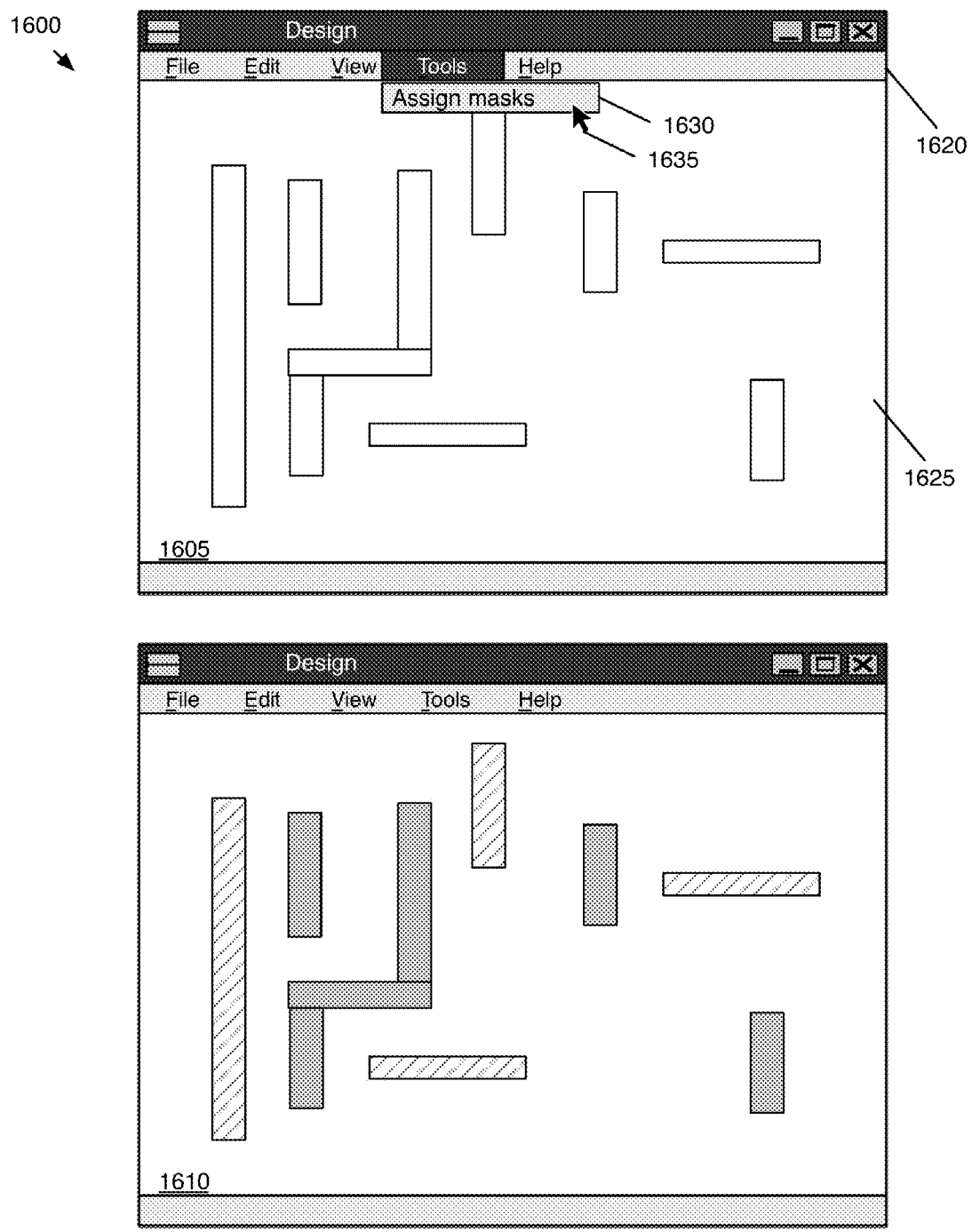
FIG. 16 illustrates a GUI 1600 of a circuit design application.

FIG. 16 conceptually illustrates a GUI 1600 of a circuit design application in two stages. The GUI 1600 includes a menu bar 1620, a display area 1625, a selectable menu item 1630, and a selection tool 1635. The menu bar 1620 has selectable menu options, such as File, Edit, View, Tools and Help. The display area 1625 shows the shapes of a layer of a design layout. The selectable menu item 1630 shows a menu item which a user may select to perform the mask assignment in some embodiments. The selection tool 1635 shows an arrow cursor which can be used to make selections in the GUI 1600. The first stage 1605 illustrates the selection tool 1635 selecting the selectable menu item to assign the shapes in the display area 1625 to masks. The second stage 1610 illustrates the results of assigning the shapes to masks. In the display area of stage 1610, the shapes have all been colored according to their newly assigned masks. In some embodiments, the mask assignment is applied without a GUI. In some embodiments, the mask assignment may be performed by the circuit designer as part of the design application, but the mask assignment may also be done separately by the manufacturer at the fabrication foundries before printing.

Figure 17:
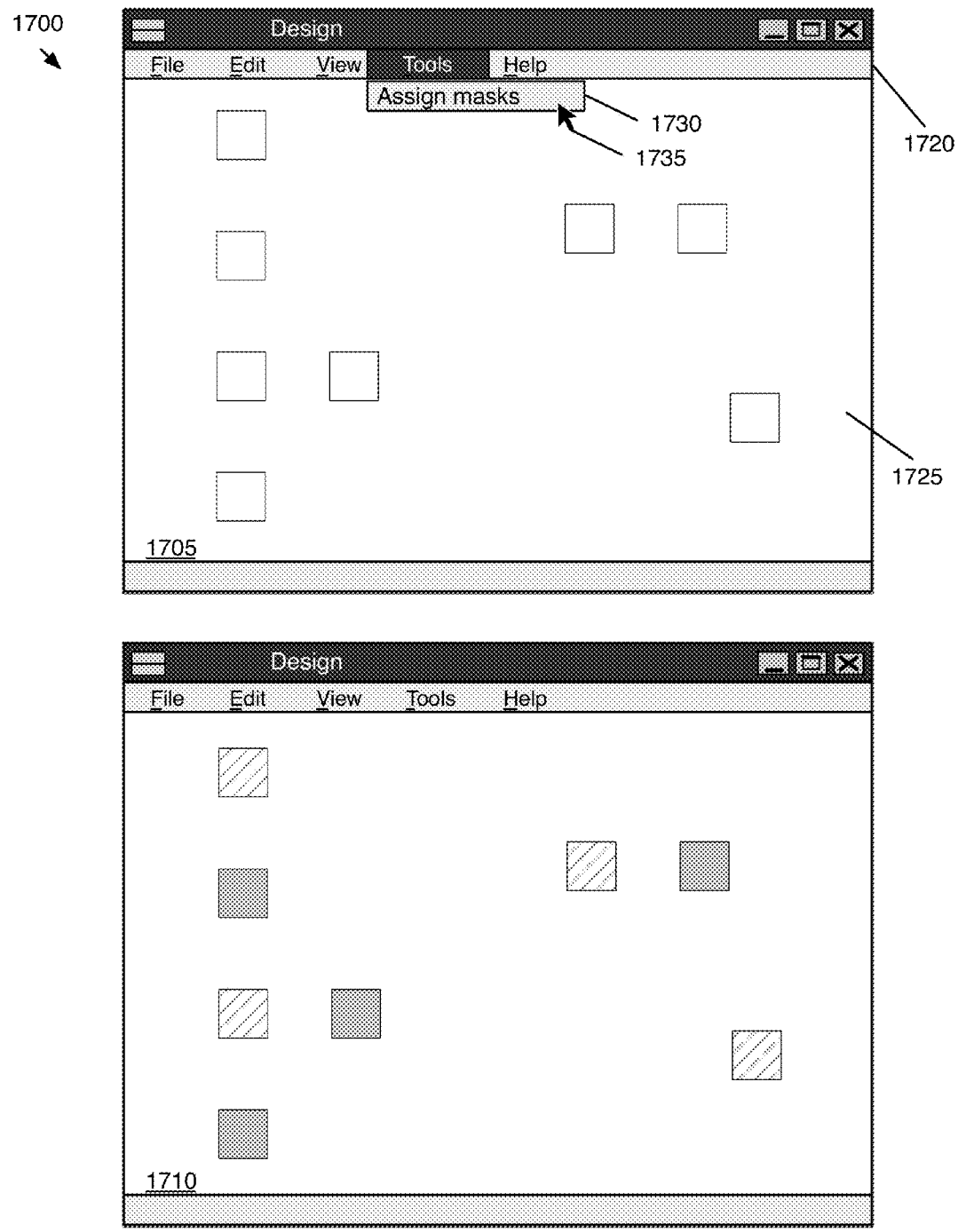
FIG. 17 illustrates a GUI 1700 of a circuit design application.

FIG. 17 conceptually illustrates a GUI 1700 of a circuit design application in two stages, similar to the GUI 1600. The GUI 1700 includes a menu bar 1720, a display area 1725, a selectable menu item 1730, and a selection tool 1735. However, in the GUI 1700, the shapes in the display area 1725 are all of a similar size, much like the node sets 605 illustrated in FIG. 6. As mentioned above, these similar sized nodes may appear in via layers where the via shapes are all of similar sizes. When assigning via shapes to various layers, in some embodiments, the nodes are not weighted and the mask assignments can be calculated based on a simple count of the nodes assigned to each layer.

III. Electronic System

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 18:
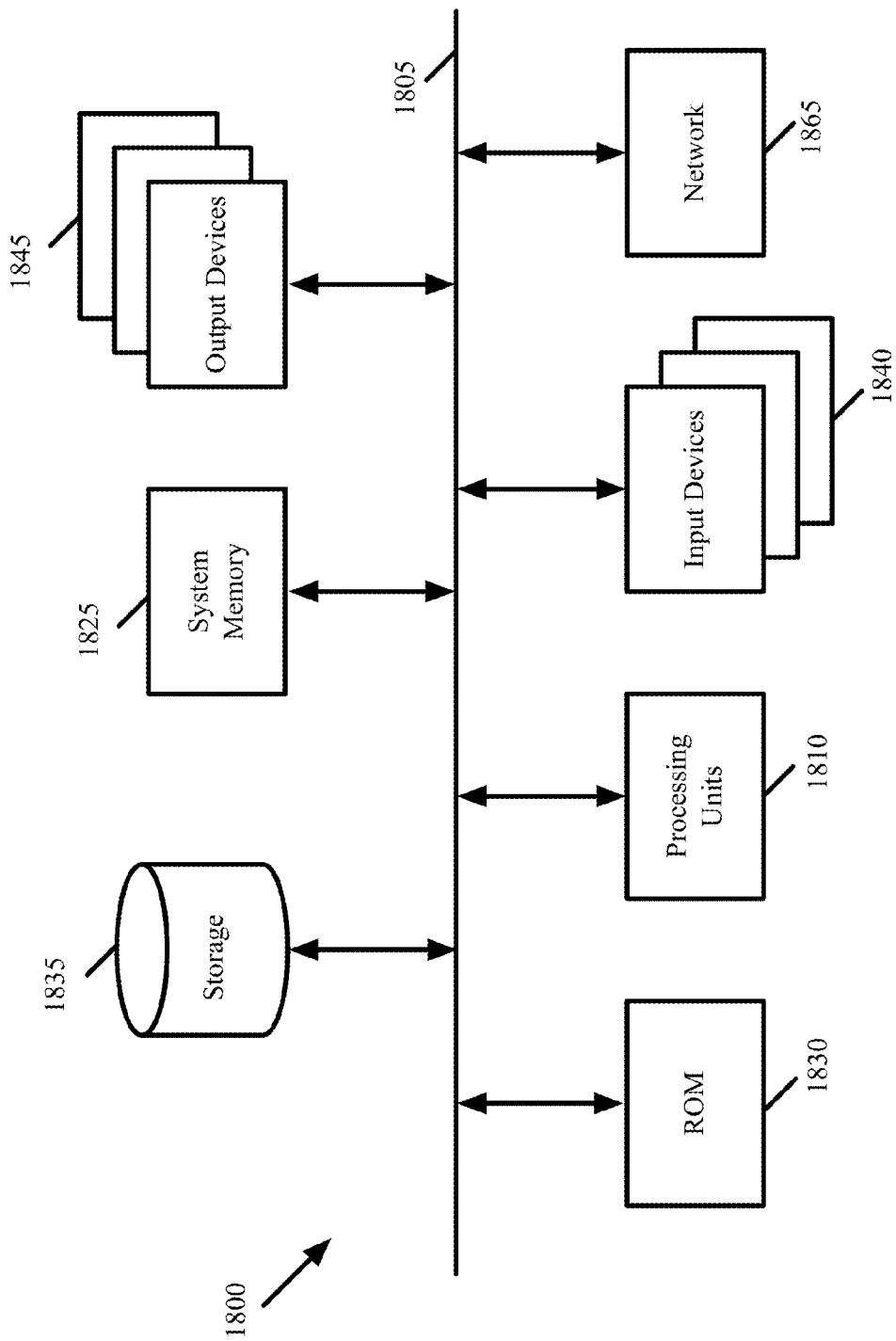
FIG. 18 illustrates an electronic system with which some embodiments of the invention are implemented.

FIG. 18 conceptually illustrates an electronic system 1800 with which some embodiments of the invention are implemented. The electronic system 1800 can be used to execute any of the control, virtualization, or operating system applications described above. The electronic system 1800 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 1800 includes a bus 1805, processing unit(s) 1810, a system memory 1825, a read-only memory 1830, a permanent storage device 1835, input devices 1840, and output devices 1845.

The bus 1805 collectively represents all system, peripheral, and chipset buses that communicatively connect the numerous internal devices of the electronic system 1800. For instance, the bus 1805 communicatively connects the processing unit(s) 1810 with the read-only memory 1830, the system memory 1825, and the permanent storage device 1835.

From these various memory units, the processing unit(s) 1810 retrieve instructions to execute and data to process in order to execute the processes of the invention. The processing unit(s) may be a single processor or a multi-core processor in different embodiments.

The read-only-memory (ROM) 1830 stores static data and instructions that are needed by the processing unit(s) 1810 and other modules of the electronic system. The permanent storage device 1835, on the other hand, is a read-and-write memory device. This device is a non-volatile memory unit that stores instructions and data even when the electronic system 1800 is off. Some embodiments of the invention use a mass-storage device (such as a magnetic or optical disk and its corresponding disk drive) as the permanent storage device 1835.

Other embodiments use a removable storage device (such as a floppy disk, flash drive, etc.) as the permanent storage device. Like the permanent storage device 1835, the system memory 1825 is a read-and-write memory device. However, unlike storage device 1835, the system memory is a volatile read-and-write memory, such a random access memory. The system memory stores some of the instructions and data that the processor needs at runtime. In some embodiments, the invention's processes are stored in the system memory 1825, the permanent storage device 1835, and/or the read-only memory 1830. From these various memory units, the processing unit(s) 1810 retrieve instructions to execute and data to process in order to execute the processes of some embodiments.

The bus 1805 also connects to the input and output devices 1840 and 1845. The input devices enable the user to communicate information and select commands to the electronic system. The input devices 1840 include alphanumeric keyboards and pointing devices (also called "cursor control devices"). The output devices 1845 display images generated by the electronic system. The output devices include printers and display devices, such as cathode ray tubes (CRT) or liquid crystal displays (LCD). Some embodiments include devices such as a touchscreen that function as both input and output devices.

As shown in FIG. 18, bus 1805 also couples electronic system 1800 to a network 1865 through a network adapter (not shown). In this manner, the computer can be a part of a network of computers (such as a local area network ("LAN"), a wide area network ("WAN"), or an Intranet, or a network of networks, such as the Internet. Any or all components of electronic system 1800 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. For example, while the examples shown illustrate splitting one or more shapes of a design layout region into two exposures, one of ordinary skill in the art would recognize that some embodiments would use similar processes to split shapes of a design layout region into more than two (e.g., three, four, etc.) exposures. One of ordinary skill in the art will also recognize that in some instances above, when referring to assigning shapes or portions of shapes to multiple exposures, the shapes (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure.

In addition, a number of the figures (including FIGS. 4, 14, 7, and 10) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details.

What is claimed is:

1. A non-transitory machine-readable medium storing a program for balancing a circuit design layout, the program comprising sets of instructions that are executed by a processor of a computing system to cause the processor to perform a plurality of acts that comprise:
   receiving a layer of the design layout including a plurality of shapes;
   performing an analysis on the layer and assigning the plurality of shapes to different masks based at least in part upon the analysis to bring respective total areas of shapes assigned to the different masks within a threshold value for the different masks, wherein the plurality of shapes already exist in the layer; and
   sending mask assignments to an output.

2. The non-transitory machine-readable medium of claim 1, wherein the sets of instructions for sending the mask assignments to the output comprises a set of instructions for displaying the plurality shapes with different colors for the different masks in a display area.

3. The non-transitory machine-readable medium of claim 1, wherein the sets of instructions for performing the analysis comprises a set of instructions for maximizing or increasing an average distance between a first number of shapes within a particular mask.

4. The non-transitory machine-readable medium of claim 1, wherein the sets of instructions for performing an analysis comprises a set of instructions for:
   identifying a set of connected shape sets, a connected shape set comprising at least one pair of shapes that are within a threshold distance of each other, wherein no shape within the connected shape set is within the threshold distance from another shape in another connected shape set; and
   identifying a set of isolated shapes that are not within the threshold distance from each other.

5. The non-transitory machine-readable medium of claim 4, wherein the set of instructions for performing an analysis further comprises a first set of instructions for processing the set of connected shape sets and then separately processing the set of isolated shapes.

6. The non-transitory machine-readable medium of claim 5, wherein the set of instructions for processing the set of connected shape sets comprises a second set of instructions for:
   ordering the set of connected shape sets based at least in part on at least-one location of a shape in the set of connected shape sets within the layer; and
   assigning a first number of shapes of a connected shape set of the set of connected shape sets to a mask of the different masks according to results of ordering the set of connected shape sets.

7. The non-transitory machine-readable medium of claim 5, wherein the set of instructions for processing the set of isolated shapes comprises a second set of instructions for:
   ordering the set of isolated shapes based at least in part on at least one location of a first isolated shape in the set of isolated shapes within the layer; and
   assigning the first isolated shape of the set of isolated shapes to a mask of the different masks.

8. The non-transitory machine-readable medium of claim 7, wherein the set of instructions for assigning the first isolated shape to a mask comprises a third set of instructions for assigning a first subset of isolated shapes based at least in part on results of processing the set of connected shape sets.

9. The non-transitory machine-readable medium of claim 1, wherein at least one of the plurality of shapes has been pre-assigned to a mask of the different masks.

10. A method for assigning shapes to masks, the method comprising:

executing a sequence of instructions with a processor of a computing system to perform a process, the process comprising:

receiving a plurality of shapes that already exist in a circuit design layout;

assigning the plurality of shapes to multiple masks in a manner that a variation between respective numbers of respective shapes assigned to the multiple masks is within a certain threshold; and sending resulting mask assignments to the output.

11. The method of claim 10, wherein sending the resulting mask assignments to the output comprises displaying the plurality of shapes using different colors for the different masks in a display area.

12. The method of claim 10, wherein assigning the plurality of shapes comprises maximizing or increasing an average distance between a first number of shapes within a particular mask.

13. The method of claim 10, wherein assigning the plurality of shapes comprises:

identifying a set of shape sets, a shape set comprising at least one pair of shapes that are within a threshold distance of each other, wherein no shape within the shape set is within the threshold distance from another shape in another shape set;

identifying a set of isolated shapes that are not within the threshold distance from each other;

assigning a first number of shapes of the shape set in the set of shape sets to a mask of different masks such that the at least one pair of shapes in the shape set that are within the threshold distance from each other are assigned to the different masks; and assigning a number of isolated shapes in the set of isolated shapes to one or more masks of the different masks to minimize or reduce the variation.

14. The method of claim 10, wherein at least one of the plurality of shapes has been pre-assigned to a mask of the different masks.

15. The method of claim 13, the process further comprising generating a disjoint node graph representing proximity between at least some of the plurality of shapes.

16. A method for assigning the shapes of a design layout to different masks, the method comprising:

executing a sequence of instructions with a processor of a computing system to perform a process, the process comprising:

receiving a layer of the design layout including a plurality of shapes;

identifying a set of shape sets, a shape set comprising multiple shapes such that at least one pair of shapes are within a threshold distance of each other, wherein no shape within the shape set is within the threshold distance of another shape in another shape set of the set of shape sets;

identifying a set of isolated shapes that are not within the threshold distance of each other;

performing a first analysis on the set of shape sets to assign the multiple shapes of the shape set to a plurality of masks;

performing a second analysis on the set of isolated shapes to assign at least one isolated shape to a mask to reduce a difference in respective cumulative measurements of the plurality of shapes assigned to the plurality of masks; and sending mask assignments to an output.

17. The method of claim 16, wherein said performing the first analysis comprises:

ordering shape sets in the set of shape sets based at least in part on at least one location within the layer; and assigning the multiple shapes of the shape set in the set of shape sets to a first mask such that the at least one pair of shapes within the threshold distance from each other are assigned to different masks of the plurality of masks.

18. The method of claim 16, wherein the act of performing the second analysis comprises:

indexing a first number of shapes of the set of isolated shapes in an order based on at least one location within the layer; and selecting a particular shape at an index of the order to maximize or increase an offset between the index and one or more indices of corresponding shapes previously assigned from the set of isolated shapes.

19. The method of claim 16, wherein the act of sending the mask assignments to the output comprises displaying the plurality of shapes using different colors for different masks in a display area.

20. The method of claim 16, wherein the respective cumulative measurements comprise a total area of shapes assigned to a particular mask.

21. The method of claim 16, wherein the respective cumulative measurements comprise a count of shapes assigned to a particular mask.

22. The method of claim 16, wherein the output comprise a display area of an interface.

23. The method of claim 17, wherein the act of assigning the multiple shapes of the shape set to the first mask comprises assigning the multiple shapes of the shape set to the plurality of masks reduce the difference.

* * * * *